(12) United States Patent
Kalnitsky et al.

(10) Patent No.: US 8,895,993 B2
(45) Date of Patent: Nov. 25, 2014

(54) LOW GATE-LEAKAGE STRUCTURE AND METHOD FOR GALLIUM NITRIDE ENHANCEMENT MODE TRANSISTOR

(75) Inventors: Alexander Kalnitsky, Hsinchu (TW); Chih-Wen Hsiung, Hsinchu (TW); Chun Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 354 days.

(21) Appl. No.: 13/049,699

(22) Filed: Mar. 16, 2011

(65) Prior Publication Data

US 2012/0193637 A1  Aug. 2, 2012

Related U.S. Application Data

(60) Provisional application No. 61/437,811, filed on Jan. 31, 2011.

(51) Int. Cl.
*H01L 31/0312* (2006.01)
*H01L 29/15* (2006.01)
*H01L 29/778* (2006.01)
*H01L 29/423* (2006.01)
*H01L 29/10* (2006.01)
*H01L 29/20* (2006.01)

(52) U.S. Cl.
CPC ...... *H01L 29/7787* (2013.01); *H01L 29/42316* (2013.01); *H01L 29/2003* (2013.01); *H01L 29/1066* (2013.01)

USPC .............................................. 257/77; 257/76

(58) Field of Classification Search
CPC ..... H01L 29/423; H01L 29/778; H01L 29/78; H01L 29/22; H01L 29/49; H01L 29/80; H01L 21/28; H01L 21/335; H01L 21/338
USPC ...................... 257/76, 77, 194, 201
See application file for complete search history.

(56) References Cited

U.S. PATENT DOCUMENTS

| | | | | |
|---|---|---|---|---|
| 3,857,074 | A * | 12/1974 | Heywang et al. | 361/307 |
| 4,829,347 | A * | 5/1989 | Cheng et al. | 257/192 |
| 5,899,732 | A * | 5/1999 | Gardner et al. | 438/473 |
| 6,914,273 | B2 * | 7/2005 | Ren et al. | 257/194 |
| 2008/0121895 | A1 * | 5/2008 | Sheppard et al. | 257/76 |
| 2010/0258841 | A1 * | 10/2010 | Lidow et al. | 257/192 |
| 2010/0258842 | A1 | 10/2010 | Lidow et al. | |
| 2012/0025270 | A1 * | 2/2012 | Chang et al. | 257/194 |

* cited by examiner

*Primary Examiner* — Khiem D Nguyen
*Assistant Examiner* — Wilner Jean Baptiste
(74) *Attorney, Agent, or Firm* — Haynes and Boone, LLP (57) ABSTRACT

The present disclosure provides a semiconductor structure. The semiconductor structure includes a gallium nitride (GaN) layer on a substrate; an aluminum gallium nitride (AlGaN) layer disposed on the GaN layer; and a gate stack disposed on the AlGaN layer. The gate stack includes a III-V compound n-type doped layer; a III-V compound p-type doped layer adjacent the III-V compound n-type doped layer; and a metal layer formed over the III-V compound p-type doped layer and the III-V compound n-type doped layer.

11 Claims, 12 Drawing Sheets

LOW GATE-LEAKAGE STRUCTURE AND METHOD FOR GALLIUM NITRIDE ENHANCEMENT MODE TRANSISTOR

This application claims the benefit of U.S. Provisional Patent Application Ser. No. 61/437,811 entitled "A LOW GATE-LEAKAGE STRUCTURE AND METHOD FOR GALLIUM NITRIDE ENHANCEMENT MODE TRANSISTOR," filed Jan. 31, 2011, herein incorporated by reference in its entirety.

BACKGROUND

In semiconductor technology, due to its characteristics, gallium nitride (GaN) is used to form various integrated circuit devices, such as high power field-effect transistors, high frequency transistors, or high electron mobility transistors (HEMTs). In one example, a GaN enhancement mode transistor is formed in an integrated circuit. The enhancement mode transistor is normally off when no bias voltage is applied to the corresponding gate. In a conventional GaN enhancement mode transistor, the gate structure is designed to have a p-type doped cap layer formed on an active region (see, for example, U.S. Patent Application Publication No. 2010/0258842). Then, a metal layer is formed on the p-type doped cap layer and is designed for voltage bias. However, this gate structure in the enhancement mode transistor suffers large gate leakage when the transistor is turned on. The large gate leakage will limit the transistor's performance and safe operating range. Therefore, a structure for a GaN enhancement mode transistor with reduced gate leakage to address the above issues and a method of making the same are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

Figure 1:
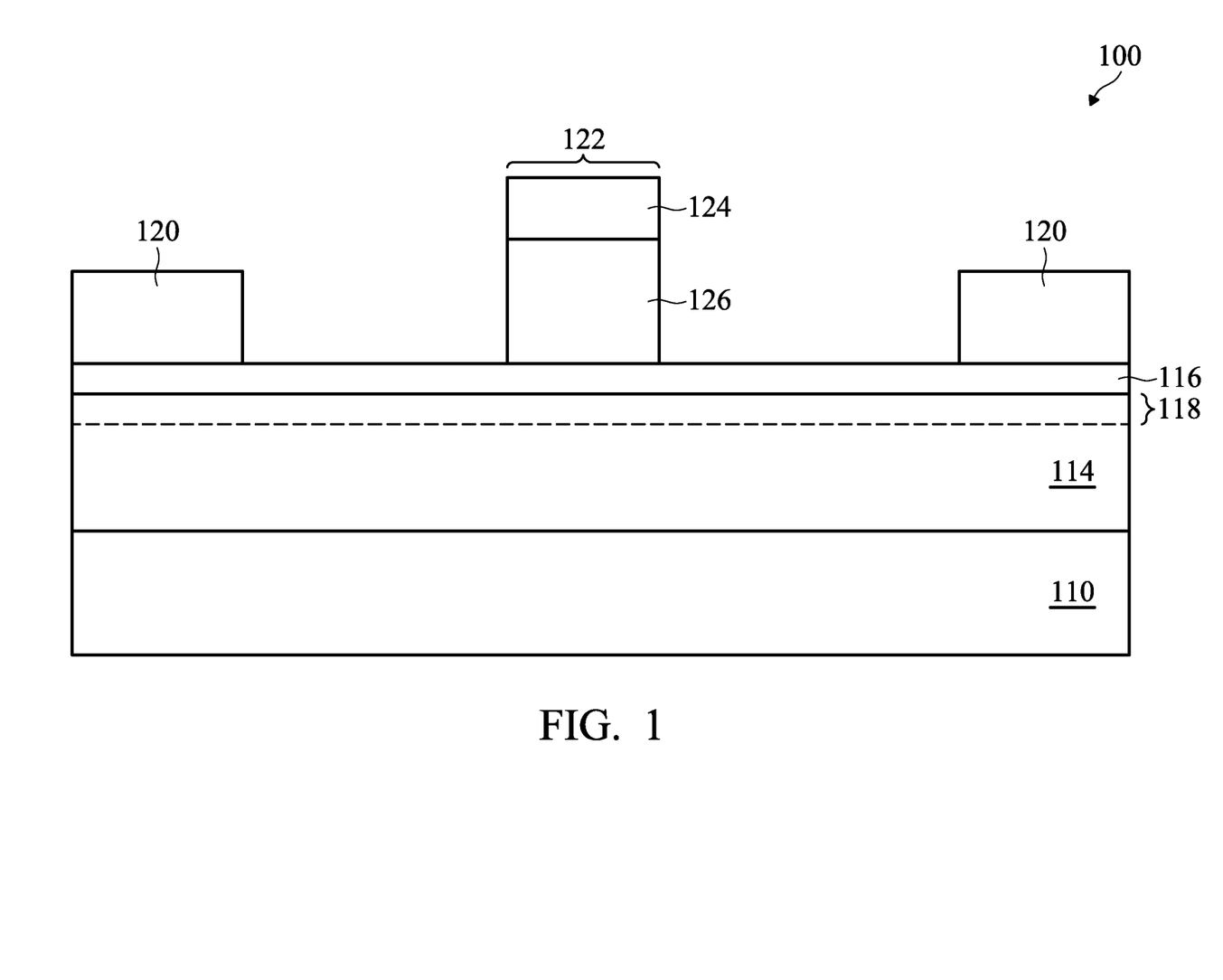
FIG. 1 is a sectional view of one embodiment of a semiconductor structure having a gallium nitride enhancement mode transistor.

FIG. 1 is a sectional view of one embodiment of a semiconductor structure 100 having a gallium nitride enhancement mode transistor. FIGS. 2a through 7a are sectional views of a gate structure incorporated in the semiconductor structure of FIG. 1 according to various embodiments of the present disclosure. FIGS. 2b through 7b are schematic views of the semiconductor structure of FIG. 1 having the gate structure of FIGS. 2a through 7a, respectively, according to various embodiments of the present disclosure. With reference to FIG. 1, FIGS. 2a through 7a, and FIGS. 2b through 7b, the semiconductor structure 100 and a method of making the same are collectively described.

Referring to FIG. 1, the semiconductor structure 100 includes a sapphire substrate 110. Alternatively, the substrate may be a silicon carbide (SiC) substrate or a silicon substrate. For example, the silicon substrate may be a (111) silicon wafer.

The semiconductor structure 100 also includes a heterojunction formed between two different semiconductor material layers, such as material layers with different band gaps. For example, the semiconductor structure 100 includes a non-doped relatively narrow-band gap channel layer and a relatively wide-band gap n-type donor supply layer. In one embodiment, the semiconductor structure 100 includes a first III-V compound layer (or referred to as a buffer layer) 114 formed on the substrate 110 and a second III-V compound layer (or referred to as a barrier layer) 116 formed on the buffer layer 114. The buffer layer 114 and the barrier layer 116 are compounds made from the III-V groups in the periodic table of elements. However, the buffer layer 114 and the barrier layer 116 are different from each other in composition. The buffer layer 114, adjacent to the barrier layer 116, is undoped or unintentionally doped (UID). In the present embodiment of the semiconductor structure 100, the buffer layer 114 includes a gallium nitride (GaN) layer (also referred to as the GaN layer 114). The barrier layer 116 includes an aluminum gallium nitride (AlGaN) layer (also referred to as AlGaN layer 116). The GaN layer 114 and AlGaN layer 116 directly contact each other. A transition layer, usually present between the substrate 110 and the buffer layer 114, is not shown.

The GaN layer 114 is undoped. Alternatively, the GaN layer 114 is unintentionally doped, such as lightly doped with n-type due to a precursor used to form the GaN layer 114. The GaN layer 114 can be epitaxially grown by metal organic vapor phase epitaxy (MOVPE) using gallium-containing precursor and nitrogen-containing precursor. The gallium-containing precursor includes trimethylgallium (TMG), triethylgallium (TEG), or other suitable chemical. The nitrogen-containing precursor includes ammonia ($NH_3$), tertiarybutylamine (TBAm), phenyl hydrazine, or other suitable chemical. In one example, the GaN layer 114 has a thickness ranging between about 0.5 micron and about 10 microns. In another example, the GaN layer 114 has a thickness of about 2 microns. MOVPE deposition method is also known as metal organic chemical vapor deposition (MOCVD).

The AlGaN layer 116 is not intentionally doped. Alternatively or additionally, the AlGaN layer 116 has n-type dopant introduced from an adjacent layer. The AlGaN layer 116 is epitaxially grown on the GaN layer 114. The AlGaN layer 116 can be epitaxially grown by MOVPE using aluminum-containing precursor, gallium-containing precursor, and nitrogen-containing precursor. The aluminum-containing precursor includes TMA, TEA, or other suitable chemical. The gallium-containing precursor includes TMG, TEG, or other suitable chemical. The nitrogen-containing precursor includes ammonia, TBAm, phenyl hydrazine, or other suitable chemical. In one example, the AlGaN layer 116 has a thickness ranging between about 5 nanometers and about 50 nanometers. In another example, the AlGaN layer 116 has a thickness of about 15 nanometers.

The band gap discontinuity between the AlGaN layer 116 and the GaN layer 114, along with the piezo-electric effect, creates a very thin layer 118 of highly mobile conducting electrons in the GaN layer 114. This thin layer 118 is referred to as a two-dimensional electron gas (2-DEG), forming a carrier channel. The thin layer 118 of 2-DEG is located at the interface of the AlGaN layer 116 and the GaN layer 114.

The semiconductor structure 100 also includes source and drain (S/D) features 120 formed on the substrate 110 and configured to electrically connect to the channel. The S/D features 120 include one or more conductive materials. For example, the S/D features 120 include metals selected from the group consisting of titanium, aluminum, nickel, and gold. The S/D features 120 can be formed by a process such as physical vapor deposition (PVD) or other proper technique. A thermal annealing process may be applied to the S/D features 120 such that the S/D features 120 and the AlGaN layer 116 react to form an alloy for effective electrical connection from the S/D features 120 to the channel. As one example, a rapid thermal annealing (RTA) apparatus and process are utilized for the thermal annealing.

A gate stack 122 is formed on the barrier layer 116 and is interposed between the source and drain features 120. The gate stack 122 includes a conductive material layer, such as a metal layer 124. The metal layer 124 functions as the gate electrode configured for voltage bias and electrical coupling with the channel. In various example, the metal layer 124 includes nickel or gold. If the metal layer of the gate stack 122 is placed in direct contact with the AlGaN layer the resulting Schottky diode gate yields a depletion mode device.

The gate stack 122 includes a junction isolation feature 126 disposed underlying the metal layer 124. The junction isolation feature 126 includes at least one n-type doped semiconductor layer and one p-type doped semiconductor layer configured as a diode. In the present embodiment, the at least one n-type doped semiconductor layer and one p-type doped semiconductor layer are a n-type doped III-V compound layer and a p-type doped III-V compound layer, respectively. In furtherance of the present embodiment, the n-type doped III-V compound layer and the p-type doped III-V compound layer are a n-type doped GaN layer (or n-GaN layer) and a p-type doped GaN layer (p-GaN layer), respectively. The diode in the gate stack provides a junction isolation effect.

Alternatively, the junction isolation feature 126 may further include another n-type doped GaN layer, another p-type doped GaN layer, or both. A junction (or diode) is formed between each paired adjacent n-GaN layer and p-GaN layer. Various diodes among the n-GaN and p-GaN layers are electrically configured in series. Those diodes not only provide isolation to the gate electrode from the channel with reduced gate leakage but are also expected to improve device switching speed as explained below. Since the various diodes are coupled in series, the corresponding capacitors are coupled in series as well. Therefore, the total capacitance of the capacitors in series will be less than any one of them. Accordingly, the device switching speed is improved due to the reduced capacitance.

In one embodiment, the interface between the metal layer and the diode is an Ohmic contact formed by a thermal annealing with an annealing temperature ranging between about 800° C. and about 900° C. In another embodiment, the interface between the metal layer and the diode is a Schottky contact. In this case, the process to form the gate stack is without the thermal annealing.

In the present embodiment, the gate stack 122, the S/D features 120, and the 2-DEG channel in the buffer layer 114 are configured as an enhancement-mode transistor, where when a positive voltage applied to the gate stack for forward bias is great enough, the enhancement-mode (E-mode) transistor is turned on. Particularly, the thus configured transistor is also referred to as an E-mode high electron mobility transistor (HEMT).

FIGS. 2a through 7a illustrate various embodiments of the gate stack 122 of the semiconductor structure 100 constructed according to various aspects of the present disclosure. In one embodiment illustrated in FIG. 2a, the junction isolation feature 126 of the gate stack 122 includes a p-GaN layer 130 and a n-GaN layer 132 disposed on the p-GaN layer 130. The p-GaN layer 130 is doped by a p-type dopant, such as magnesium, calcium, zinc beryllium, carbon, or combinations thereof. In one embodiment, the p-GaN layer 130 can be formed by MOCVD or other suitable technique. In another embodiment, the p-GaN layer 130 has a thickness ranging between about 1 nm and about 100 nm. The n-GaN layer 132 is doped by a n-type dopant, such as silicon, oxygen, or a combination thereof. In one embodiment, the n-GaN layer 132 can be formed by MOCVD or other suitable technique. In another embodiment, the n-GaN layer 132 has a thickness ranging between about 1 nm and about 100 nm.

Figure 2A:
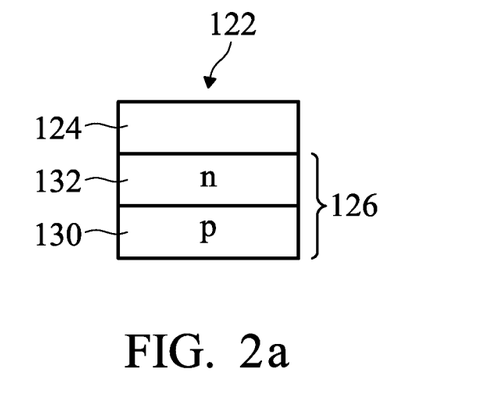
FIGS. 2a, through 7a are sectional views of a gate structure incorporated in the semiconductor structure of FIG. 1 according to various embodiments.
Figure 2B:
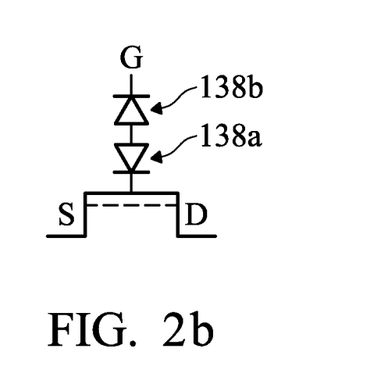
FIGS. 2b, through 7b are schematic views of the semiconductor structure of FIG. 1 with the gate stack of FIGS. 2a through 7a, respectively, according to various embodiments.

Illustrated in FIG. 2b is a schematic view of the E-mode transistor of the semiconductor structure 100 having the gate stack 122 of FIG. 2a. In FIG. 2b, "G", "S", and "D" represent gate, source, and drain, respectively. The 2-DEG channel is defined between the source and drain. A diode 138a is formed between the p-GaN layer 130 and the barrier layer 116 having n-type dopant. A second diode 138b is formed between the p-GaN layer 130 and the n-GaN layer 132. The diodes 138a and 138b are configured in series. The resultant capacitance from the diodes 138a and 138b is reduced while the device switching speed is increased.

Figure 3A:
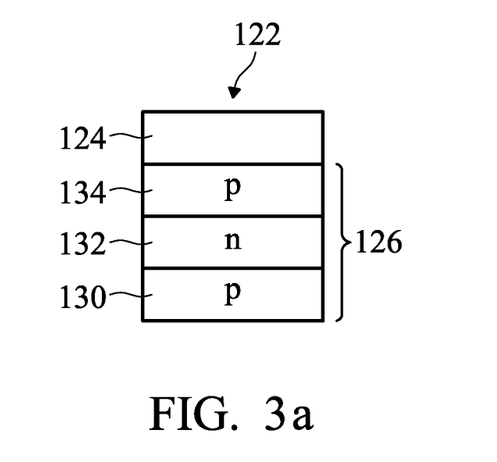

In another embodiment illustrated in FIG. 3a, the junction isolation feature 126 of the gate stack 122 is similar to the junction isolation feature 126 in FIG. 2a but further includes an additional p-GaN layer 134 disposed on the n-GaN layer 132. The additional p-GaN layer 134 and the n-GaN layer 132 are configured to form another diode for additional isolation effect. The additional p-GaN layer 134 is similar to the p-GaN layer 130 in terms of composition and formation. For example, the p-GaN layer 134 is doped by a p-type dopant, such as magnesium, calcium, zinc beryllium, carbon, or combinations thereof.

Figure 3B:
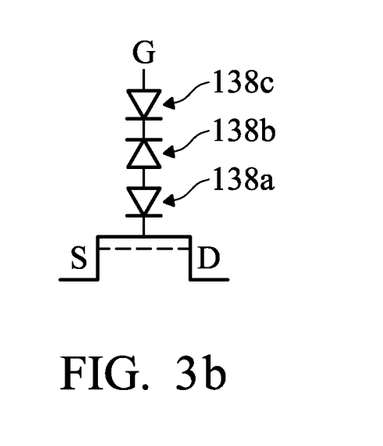

Illustrated in FIG. 3b is a schematic view of the E-mode transistor of the semiconductor structure 100 having the gate stack 122 of FIG. 3a. Symbols "G", "S", and "D" represent gate, source, and drain, respectively. The 2-DEG channel is defined between the source and drain. A diode 138a is formed between the p-GaN layer 130 and the barrier layer 116 having n-type dopant. A second diode 138b is formed between the p-GaN layer 130 and the n-GaN layer 132. A third diode 138c is formed between the n-GaN layer 132 and the p-GaN layer 134. The diodes 138a, 138b, and 138c are configured in series. The resultant capacitance between the gate electrode and the channel from these diodes is further reduced while the device switching speed is further increased.

Figure 4A:
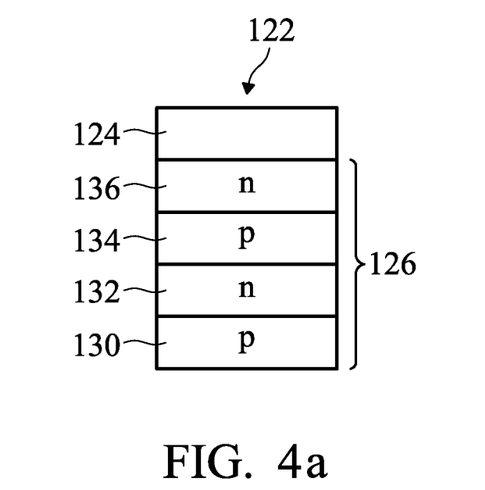

In another embodiment illustrated in FIG. 4a, the junction isolation feature 126 of the gate stack 122 is similar to the junction isolation feature 126 in FIG. 2a but further includes an additional p-GaN layer 134 disposed on the p-GaN layer 132 and an additional n-GaN layer 136 disposed on the p-GaN layer 134. The additional p-GaN layer 134 and the additional n-GaN layer 136 are similar to the p-GaN layer 130 and the n-GaN layer 132, respectively, in terms of composition and formation. For example, the n-GaN layer 136 is doped by a n-type dopant, such as silicon or oxygen.

Figure 4B:
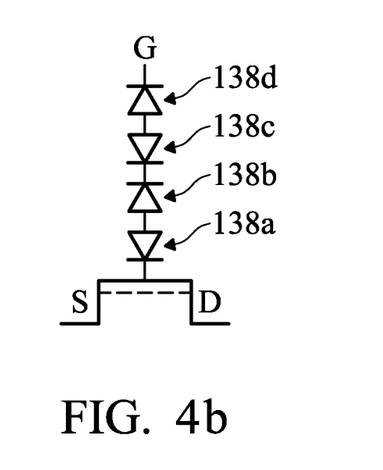

Illustrated in FIG. 4b is a schematic view of the E-mode transistor of the semiconductor structure 100 having the gate stack 122 of FIG. 4a. Symbols "G", "S", and "D" represent gate, source, and drain, respectively. The 2-DEG channel is defined between the source and drain. A diode 138a is formed between the p-GaN layer 130 and the barrier layer 116 having n-type dopant. A second diode 138b is formed between the p-GaN layer 130 and the n-GaN layer 132. A third diode 138c is formed between the n-GaN layer 132 and the p-GaN layer 134. A fourth diode 138d is formed between the p-GaN layer 134 and the n-GaN layer 136. The diodes 138a, 138b, 138c, and 138d are configured in series. The resultant capacitance between the gate electrode and the channel from these diodes is further reduced while the device switching speed is further increased thereby.

Figure 5A:
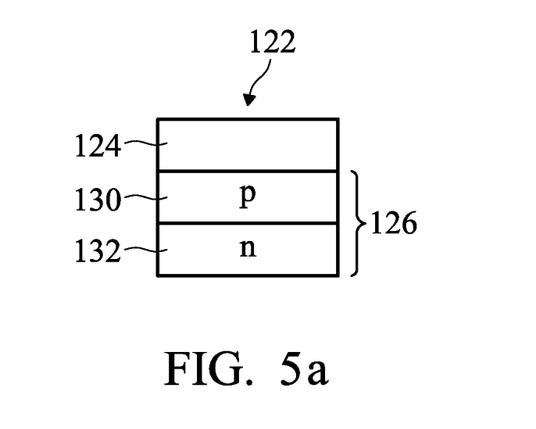

In one embodiment illustrated in FIG. 5a, the junction isolation feature 126 of the gate stack 122 includes a n-GaN layer 132 and a p-GaN layer 130 disposed on the n-GaN layer 132. The gate stack 122 of FIG. 5a is similar to the gate stack 122 of FIG. 2a but the p-GaN layer 130 and the n-GaN layer 132 are configured differently. The p-GaN layer 130 is doped by a p-type dopant, such as magnesium, calcium, zinc beryllium, carbon, or combinations thereof. In one embodiment, the p-GaN layer 130 can be formed by MOCVD or other suitable technique. In another embodiment, the p-GaN layer 130 has a thickness ranging between about 1 nm and about 100 nm. The n-GaN layer 132 is doped by a n-type dopant, such as silicon, oxygen, or a combination thereof. In one embodiment, the n-GaN layer 132 can be formed by MOCVD or other suitable technique. In another embodiment, the n-GaN layer 132 has a thickness ranging between about 1 nm and about 100 nm.

Figure 5B:
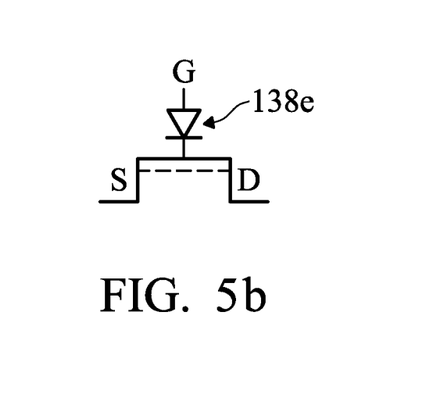

Illustrated in FIG. 5b is a schematic view of the E-mode transistor of the semiconductor structure 100 having the gate stack 122 of FIG. 5a. A diode 138e is formed between the p-GaN layer 130 and the n-GaN layer 132 for isolation to prevent gate leakage.

Figure 6A:
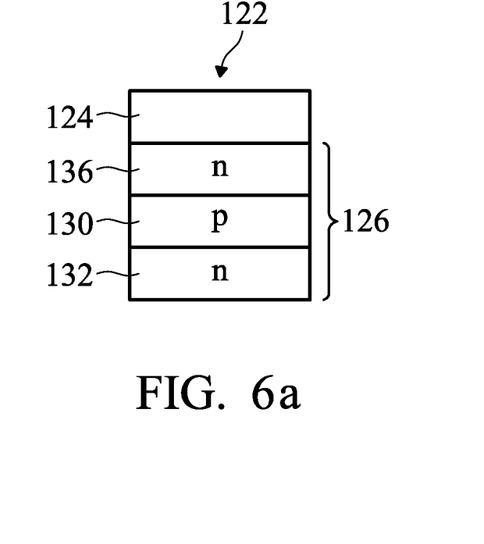

In another embodiment illustrated in FIG. 6a, the junction isolation feature 126 of the gate stack 122 is similar to the junction isolation feature 126 in FIG. 3a but has a different configuration. Particularly, the n-GaN layer 132 is disposed on the barrier layer 116. The p-GaN layer 130 is disposed on the n-GaN layer 132. The additional n-GaN layer 136 is disposed on the p-GaN layer 130.

Figure 6B:
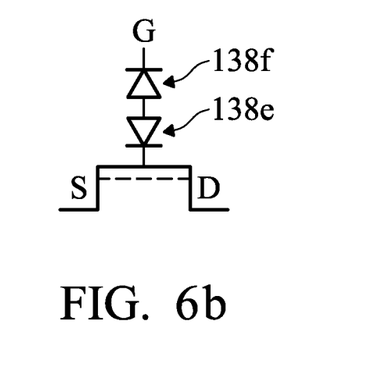

Illustrated in FIG. 6b is a schematic view of the E-mode transistor of the semiconductor structure 100 having the gate stack 122 of FIG. 6a. One diode 138e is formed between the p-GaN layer 130 and the n-GaN layer 132. Another diode 138f is formed between the p-GaN layer 130 and the n-GaN layer 136. The diodes 138e and 138f are configured in series. The resultant capacitance between the gate electrode and the channel from these diodes provides isolation to prevent gate leakage and further enhances device switching speed.

Figure 7A:
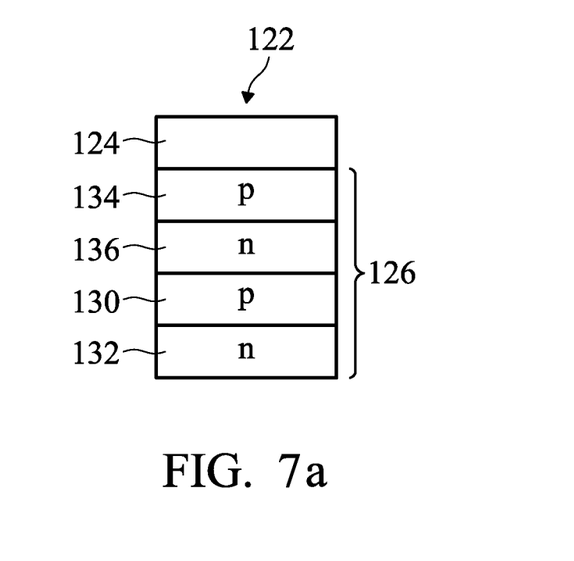

In another embodiment illustrated in FIG. 7a, the junction isolation feature 126 of the gate stack 122 is similar to the junction isolation feature 126 in FIG. 4a but configured differently. The gate stack 122 in FIG. 7a includes the n-GaN layer 132 on the barrier layer 116, the p-GaN layer 130 on the n-GaN layer 132, the additional n-GaN layer 136 on the p-GaN layer 130 and the additional p-GaN layer 134 disposed on the additional n-GaN layer 136. Each of the n-GaN layers and the p-GaN layers is similar to the corresponding layer of the gate stack 122 in FIG. 4a in terms of composition and formation. For example, the n-GaN layer 136 is doped by a n-type dopant, such as silicon or oxygen.

Figure 7B:
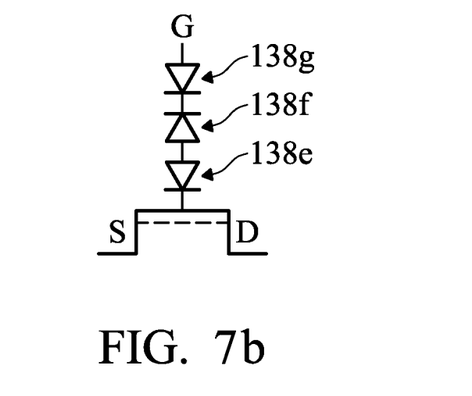

Illustrated in FIG. 7b is a schematic view of the E-mode transistor of the semiconductor structure 100 having the gate stack 122 of FIG. 4a. Symbols "G", "S", and "D" represent gate, source, and drain, respectively. The 2-DEG channel is defined between the source and drain. A diode 138e is formed between the n-GaN layer 132 and the p-GaN layer 130. A second diode 138f is formed between the p-GaN layer 130 and the additional n-GaN layer 136. A third diode 138g is formed between the n-GaN layer 136 and the additional p-GaN layer 134. The diodes 138e, 138f, and 138g are configured in series. The resultant capacitance between the gate electrode and the channel from these diodes is reduced while the device switching speed is further increased thereby.

Other advantages may also be present in different embodiment. For example, the threshold voltage of the corresponding E-mode transistors can be adjustable by varying the doping and/or the thickness of the n-p diodes.

Figure 8:
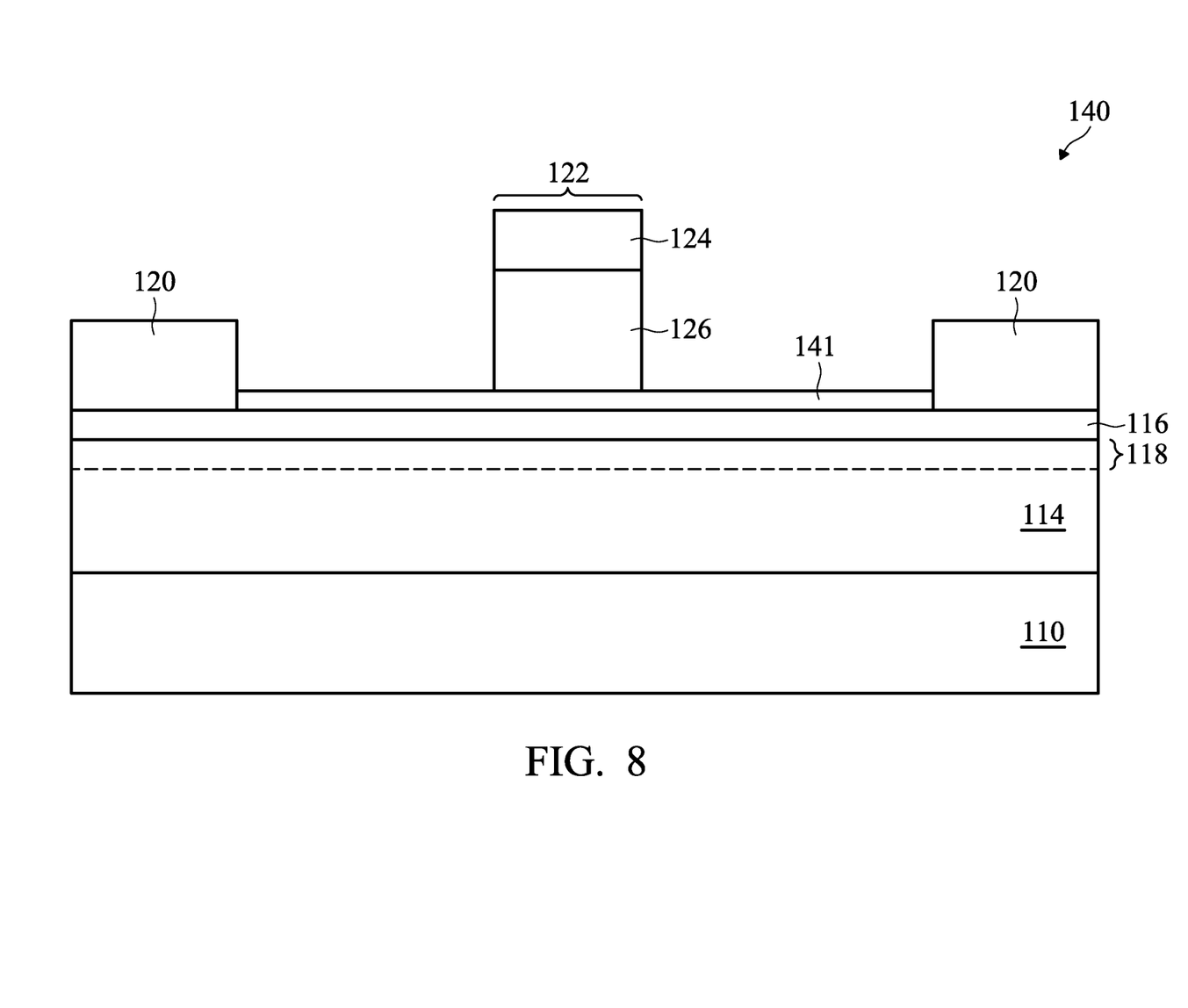
FIG. 8 is a sectional view of another embodiment of a semiconductor structure having a gallium nitride enhancement mode transistor.

FIG. 8 is a sectional view of a semiconductor structure 140 having a gallium nitride enhancement mode transistor constructed according to one or more other embodiments. With reference to FIG. 8, FIGS. 2a through 7a, and FIGS. 2b through 7b, the semiconductor structure 140 and a method of making the same are collectively described.

The semiconductor structure 140 is similar to the semiconductor structure 100 of FIG. 1 but further includes a dielectric material layer (or insulating layer) 141 formed on the barrier layer 116 and disposed between the source and drain features 120. Particularly, the dielectric material layer 141 is formed between the barrier layer 116 and the gate stack 122. The dielectric material layer 141 includes a dielectric material selected from the group consisting of silicon oxide ($SiO_2$), silicon nitride ($Si_3N_4$), aluminum oxide ($Al_2O_3$), tantalum oxide ($Ta_2O_5$), titanium oxide ($TiO_2$), zinc oxide ($ZnO_2$), hafnium oxide ($HfO_2$) or combinations thereof, according to various examples. In one embodiment, the dielectric material layer 141 has a thickness ranging between about 3 nm and about 100 nm. The dielectric material layer 141 can be formed by any proper fabrication technique, such as MOCVD, chemical vapor deposition (CVD), PVD, atomic layer deposition (ALD), or thermal oxidation. The dielectric material layer 141 provides further isolation to prevent gate leakage and further improve device switching speed.

The gate stack 122 is similar to the gate stack 122 of FIG. 1. For example, the gate stack 122 includes the junction isolation feature 126 disposed on the dielectric material layer 141 and the metal layer 124 on the junction isolation feature 126. Furthermore, the gate stack 122 may have one of the structures illustrated in FIGS. 2a through 7a according to various embodiments.

Figure 9:
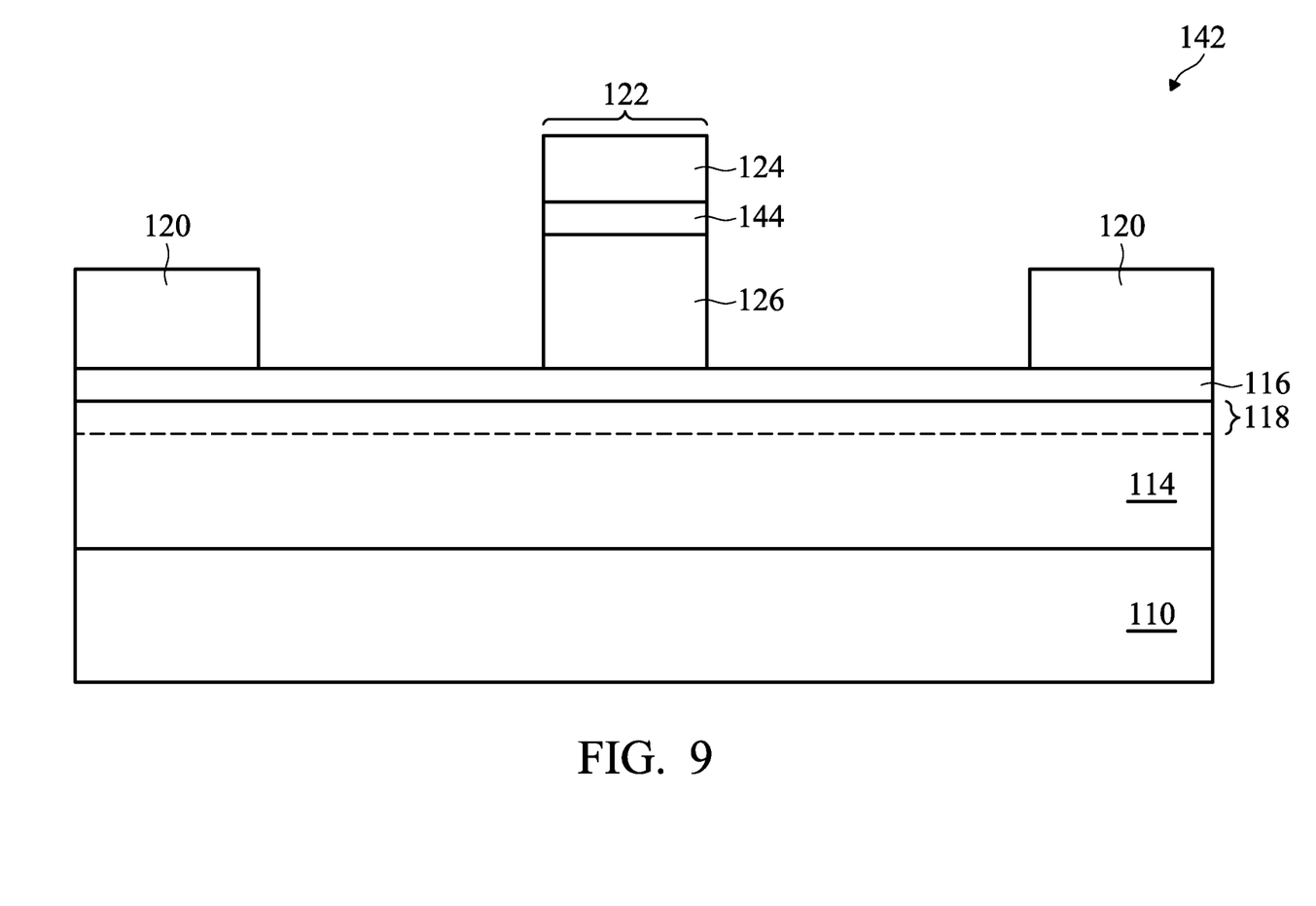
FIG. 9 is a sectional view of another embodiment of a semiconductor structure having a gallium nitride enhancement mode transistor.
Figure 10:
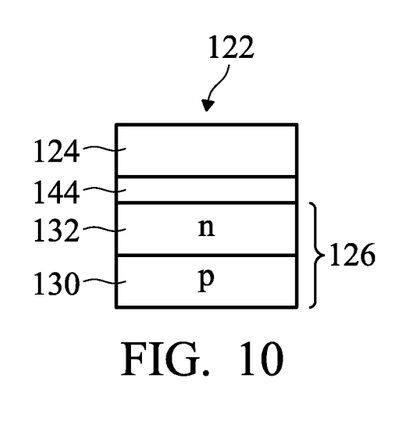
FIGS. 10 through 15 are sectional views of a gate structure incorporated in the semiconductor structure of FIG. 9 according to various embodiments.

FIG. 9 is a sectional view of one embodiment of a semiconductor structure 142 having a gallium nitride enhancement mode transistor. FIGS. 10 through 15 are sectional views of a gate structure incorporated in the semiconductor structure of FIG. 9 according to various embodiments of the present disclosure. With reference to FIG. 9 and FIGS. 10 through 15, the semiconductor structure 142 and a method of making the same are collectively described.

The semiconductor structure 142 is similar to the semiconductor structure 100 of FIG. 1 but the gate stack 122 further includes a dielectric material layer (or insulating layer) 144 disposed between the metal layer 124 and the junction isolation feature 126. The dielectric material layer 144 includes a dielectric material selected from the group consisting of $SiO_2$, $Si_3N_4$, $Al_2O_3$, $Ta_2O$, $TiO_2$, $ZnO_2$, $HfO_2$, or combinations thereof, according to various examples. In one embodiment, the dielectric material layer 144 has a thickness ranging between about 3 nm and about 100 nm. The dielectric material layer 144 can be formed by any proper fabrication technique, such as MOCVD, CVD, PVD, ALD, or thermal oxidation. The dielectric material layer 144 provides further isolation to prevent gate leakage and further improve device switching speed.

FIGS. 10 through 15 illustrate various embodiments of the gate stack 122 of the semiconductor structure 142 constructed according to various aspects of the present disclosure. In one embodiment illustrated in FIG. 10, the gate stack 122 is similar to the gate stack 122 of FIG. 2a but further includes the dielectric material layer 144 disposed between the junction isolation feature 126 and the metal layer 124. Particularly, the junction isolation feature 126 of the gate stack 122 includes a p-GaN layer 130 and a n-GaN layer 132 disposed on the p-GaN layer 130. The p-GaN layer 130 is doped by a p-type dopant, such as magnesium, calcium, zinc beryllium, carbon, or combinations thereof. In one embodiment, the p-GaN layer 130 can be formed by MOCVD or other suitable technique. In another embodiment, the p-GaN layer 130 has a thickness ranging between about 1 nm and about 100 nm. The n-GaN layer 132 is doped by a n-type dopant, such as silicon, oxygen, or a combination thereof. In one embodiment, the n-GaN layer 132 can be formed by MOCVD or other suitable technique. In another embodiment, the n-GaN layer 132 has a thickness ranging between about 1 nm and about 100 nm. The gate stack 122 further includes the dielectric material layer 144 disposed on the junction isolation feature 126 and the metal layer 124 disposed on the dielectric material layer 144.

Figure 11:
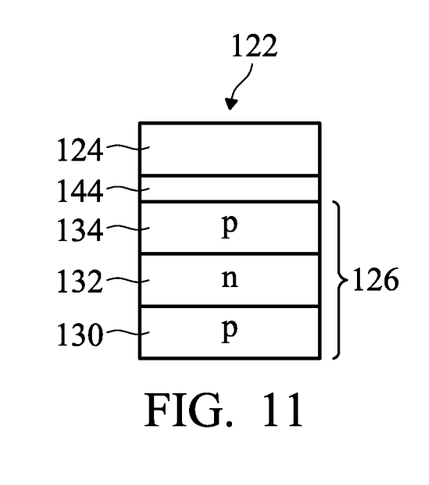
Figure 12:
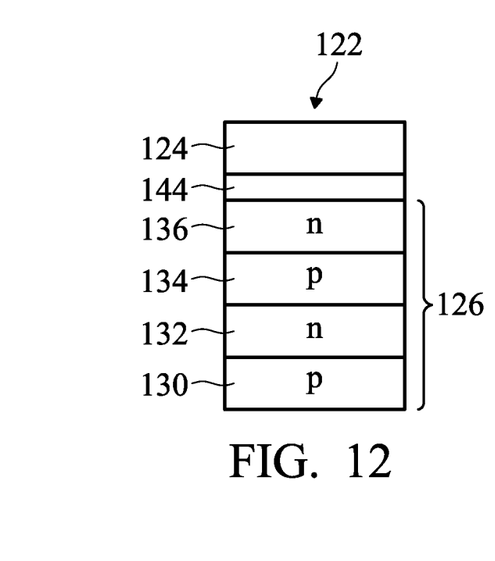
Figure 13:
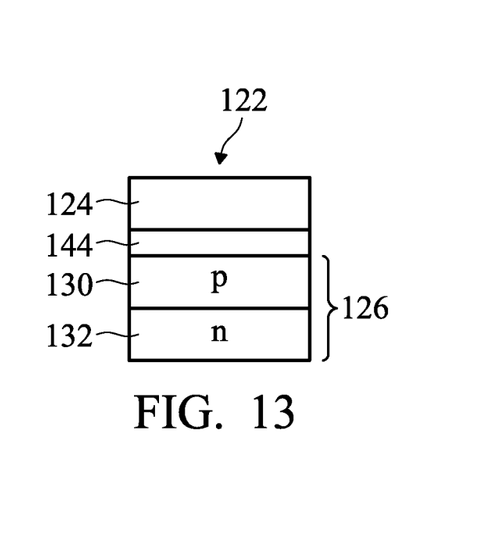
Figure 14:
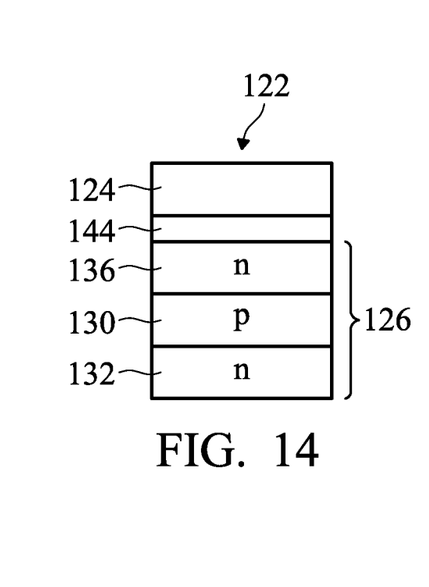
Figure 15:
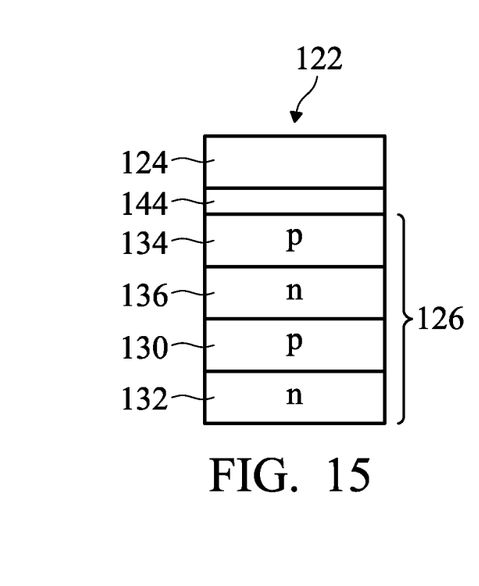

In one embodiment illustrated in FIG. 11, the gate stack 122 is similar to the gate stack 122 of FIG. 3a but further includes the dielectric material layer 144 disposed between the junction isolation feature 126 and the metal layer 124.

In other embodiments illustrated in FIGS. 12 through 15, the gate stack 122 is similar to the gate stack 122 of FIGS. 4a through 7a, respectively, but further includes the dielectric material layer 144 disposed between the junction isolation feature 126 and the metal layer 124. Various advantages may be present in different embodiments. Those advantages include preventing gate leakage, enhancing device switching speed, and adjusting threshold voltages of the corresponding E-mode transistors by varying doping and/or thickness of the n-p diodes.

Figure 16:
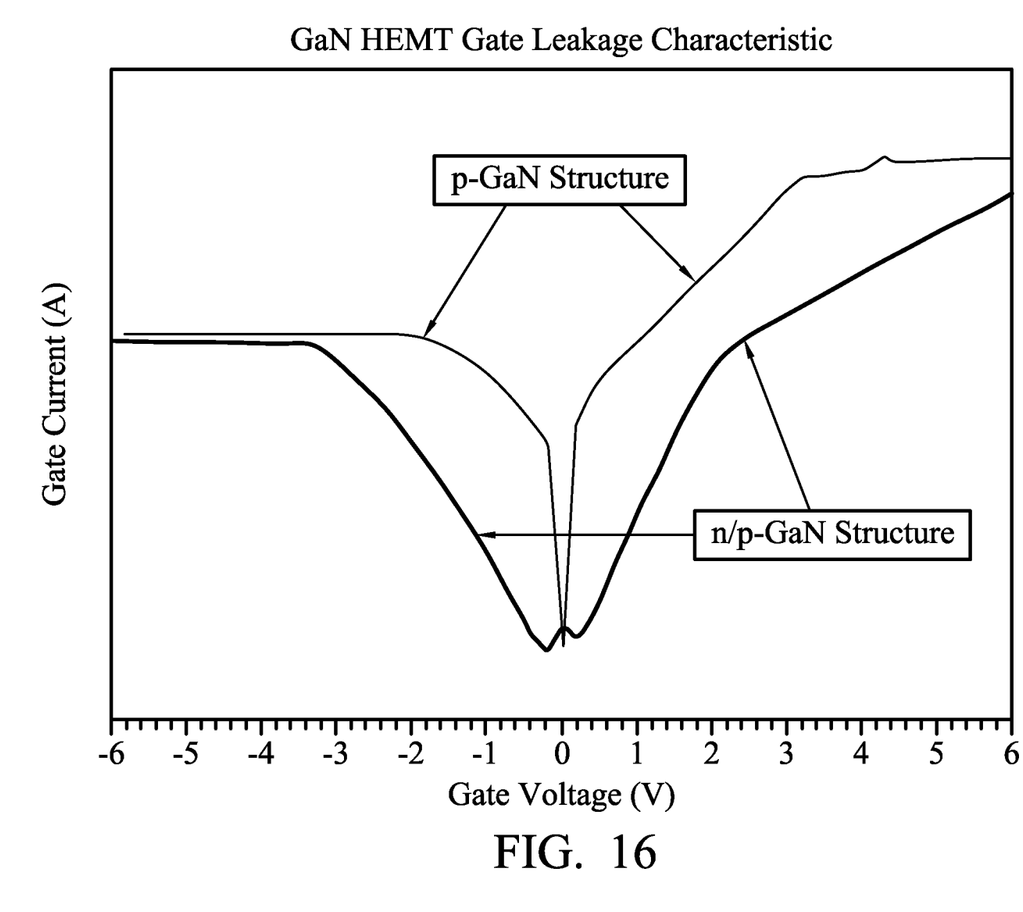
FIG. 16 is a diagrammatic view of the gate leakage characteristic data of the gallium nitride enhancement mode transistor.

FIG. 16 is a diagrammatic view of the gate leakage characteristic data vs. gate voltage. The gate leakage characteristic data are from the simulation and are presented in curves of gate current vs. gate voltage. The curve labeled as "n/p-GaN structure" is associated with the gate leakage data according to an example of the GaN enhancement-mode transistor having one of the semiconductor structures 100, 140 and 142. The curve labeled as "p-GaN structure" is used as a reference and is associated with the gate leakage data simulated from one example of the GaN structure that includes only a p-type doped cap layer and a metal layer disposed in its gate stack. As illustrated, the gate leakage current of the "n/p-GaN structure" is substantially reduced and the device performance is improved accordingly.

Although various embodiments are provided and explained in the present disclosure. Other alternatives and embodiments may be used without departure from the spirit of the present disclosure. For example, the E-mode transistor of the semiconductor structure 100 (or 140 or 142) may further includes an aluminum nitride (AlN) layer disposed between the buffer layer 114 and the barrier layer 116. In one embodiment, the AlN layer is selectively epitaxy grown on the buffer layer 114. The AlN layer can be epitaxy grown by MOVPE using aluminum-containing precursor and nitrogen-containing precursor. The aluminum-containing precursor includes TMA, TEA, or other suitable chemical. The nitrogen-containing precursor includes ammonia, TBAm, phenyl hydrazine, or other suitable chemical. In one example, the AlN layer has a thickness ranging between about 5 nm and about 50 nm.

Alternatively, the AlN layer can replace the AlGaN layer as the barrier layer. In another embodiment, the dimensions of various n-GaN and p-GaN layers may vary according to the device's specification, performance, and circuit requirements. For example, the thicknesses of the various n-GaN and p-GaN layers can be adjusted according the threshold voltage or other device/circuit considerations. In another embodiment, the gate stack 122 of the semiconductor structure 100 (or 140 or 142) may include more n-GaN and/or p-GaN layers configured in the junction isolation feature 126.

Thus, the present disclosure provides a semiconductor structure in one embodiment. The semiconductor structure includes a gallium nitride (GaN) layer on a substrate; an aluminum gallium nitride (AlGaN) layer disposed on the GaN layer; and a gate stack disposed on the AlGaN layer. The gate stack includes a III-V compound n-type doped layer; a III-V compound p-type doped layer adjacent the III-V compound n-type doped layer; and a metal layer formed over the III-V compound p-type doped layer and the III-V compound n-type doped layer.

In one embodiment, the gate stack further includes a dielectric layer underlying the metal layer and overlying the III-V compound n-type doped layer and the III-V compound p-type doped layer. In another embodiment, the gate stack further includes a dielectric layer underlying the metal layer, the III-V compound n-type doped layer, and the III-V compound p-type doped layer. The semiconductor structure may further include another III-V compound doped layer. In yet another embodiment, the III-V compound n-type doped layer includes a n-type GaN layer and the III-V compound p-type doped layer includes a p-type GaN layer. In yet another embodiment, the III-V compound n-type doped layer is doped with an impurity selected from the group consisting of silicon and oxygen. In yet another embodiment, the III-V compound p-type doped layer is doped with an impurity selected from the group consisting of magnesium, calcium, zinc, beryllium, and carbon. In yet another embodiment, each of the III-V compound p-type doped layer and the III-V compound n-type doped layer has a thickness ranging between about 1 nanometer and about 100 nanometers. The GaN layer is undoped or unintentionally doped. The semiconductor structure further includes a source and drain feature configured with the GaN layer, the AlGaN layer, and gate stack to form an enhancement-mode transistor.

The present disclosure also provides an enhancement-mode transistor in another embodiment. The enhancement-mode transistor includes a first III-V compound layer on a substrate; a second III-V compound layer directly on the first III-V compound layer and different from the first III-V compound layer in composition; and a gate stack on the second III-V compound layer, the gate stack including a pair of a n-type doped III-V compound layer and a p-type doped III-V compound layer configured as a diode. In one embodiment, the substrate includes one of a sapphire substrate, a silicon substrate, and a silicon carbide substrate; the first III-V compound layer includes a gallium nitride (GaN) layer; and the second III-V compound layer includes an aluminum gallium nitride (AlGaN) layer. In another embodiment, the gate stack further includes a metal layer disposed on the pair of the n-type doped III-V compound layer and the p-type doped III-V compound layer; the n-type doped III-V compound layer includes a n-type doped GaN layer; and the p-type doped III-V compound layer includes a p-type doped GaN layer. In yet another embodiment, the metal layer has an Ohmic contact with the pair of the n-type doped III-V compound layer and the p-type doped III-V compound layer by implementing a thermal annealing process. In yet another embodiment, the gate stack further includes an insulating material layer between the metal layer and the pair of the n-type doped III-V compound layer and the p-type doped III-V compound layer. In yet another embodiment, the gate stack further includes an insulating material layer between the second III-V compound layer and the pair of the n-type doped III-V compound layer and the p-type doped III-V compound layer. The enhancement-mode transistor may further include an aluminum nitride (AlN) layer interposed between the first and second III-V compound layers. The enhancement-mode transistor may further include a source and drain feature interposed by the gate stack, wherein the source and drain feature includes a metal selected from the group consisting of titanium, aluminum, nickel, and gold. In one embodiment, the gate stack may further include a third doped III-V compound layer adjacent the pair of the n-type doped III-V compound layer and the p-type doped III-V compound layer.

The present disclosure also provides a method for making an enhancement-mode transistor. The method includes forming a first III-V compound layer on a substrate; forming a second III-V compound layer on the first III-V compound layer, wherein the second III-V compound layer is different from the first III-V compound layer; forming a gate stack; and forming source and drain features on the second III-V compound layer and interposed by the gate stack. The forming of the gate stack further includes forming a diode having a pair of a n-type doped III-V compound layer and a p-type doped III-V compound layer, and forming a metal layer on the diode.

In various embodiments of the method, the forming of the first III-V compound layer may include forming an undoped gallium nitride layer; the forming of the second III-V compound layer may include forming an aluminum gallium nitride layer; and the forming of the diode may include forming a n-type gallium nitride layer doped by one of silicon and oxygen and forming a p-type gallium nitride layer doped by one of magnesium, calcium, zinc, beryllium, and carbon. In another embodiment, the forming of the gate stack includes performing a thermal annealing to form an Ohmic contact between the diode and the metal layer. In yet another embodiment, the forming of the gate stack further includes forming an insulating material layer between the diode and the metal layer.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A semiconductor structure comprising:
   a gallium nitride (GaN) layer on a substrate;
   an aluminum gallium nitride (AlGaN) layer disposed on the GaN layer; and
   a gate stack disposed on the AlGaN layer, wherein the gate stack includes:
     a pair of layers forming a diode, wherein the pair of layers includes:
       a Group III-V compound n-type doped layer; and
       a Group III-V compound p-type doped layer adjacent the Group III-V compound n-type doped layer;
     a metal layer formed over the pair of layers; and
     a first dielectric layer interposing the pair of layers and the metal layer;
     wherein the Group III-V compound n-type doped layer, the Group III-V compound p-type doped layer, and the metal layer have substantially co-planar sidewalls.

2. The semiconductor structure of claim 1, wherein the gate stack further includes a second dielectric layer underlying the metal layer and underlying the pair of layers.

3. The semiconductor structure of claim 1, further comprising another pair of Group III-V compound doped layers.

4. The semiconductor structure of claim 1, wherein the Group III-V compound n-type doped layer includes a n-type GaN layer and the Group III-V compound p-type doped layer includes a p-type GaN layer.

5. The semiconductor structure of claim 4, wherein the Group III-V compound n-type doped layer is doped with an impurity selected from the group consisting of silicon and oxygen.

6. The semiconductor structure of claim 4, wherein the Group III-V compound p-type doped layer is doped with an impurity selected from the group consisting of magnesium, calcium, zinc, beryllium, and carbon.

7. The semiconductor structure of claim 1, wherein each of the Group III-V compound p-type doped layer and the Group III-V compound n-type doped layer has a thickness ranging between about 1 nanometer and about 100 nanometers.

8. The semiconductor structure of claim 1, wherein the GaN layer is undoped or unintentionally doped.

9. The semiconductor structure of claim 8, further comprising source and drain features configured with the GaN layer, the AlGaN layer, and gate stack to form an enhancement-mode transistor.

10. A semiconductor structure comprising:
    a gallium nitride (GaN) layer on a substrate;
    an aluminum gallium nitride (AlGaN) layer disposed on the GaN layer;
    a barrier layer disposed on the GaN layer; and
    a gate stack disposed on the barrier layer, wherein the gate stack includes:
      a Group III-V compound n-type doped layer;
      a Group III-V compound p-type doped layer adjacent the Group III-V compound n-type doped layer;
      a dielectric layer disposed on the Group III-V compound p-type doped layer; and a metal layer formed over the Group III-V compound p-type doped layer and the Group III-V compound n-type doped layer.

11. The semiconductor structure of claim 10, wherein the Group III-V compound p-type doped layer and the AlGaN layer form a first diode; and wherein the Group III-V compound p-type doped layer and the Group III-V compound n-type doped layer form a second diode.

* * * * *